United States Patent [19]

Leonov

[11] Patent Number: 4,682,396
[45] Date of Patent: Jul. 28, 1987

[54] CENTERING/POSITIONING APPARATUS FOR WAFER AND VACUUM CHUCK

[75] Inventor: Mark Leonov, Santa Clara, Calif.

[73] Assignee: Intel Corporation, Santa Clara, Calif.

[21] Appl. No.: 872,022

[22] Filed: Jun. 9, 1986

Related U.S. Application Data

[63] Continuation of Ser. No. 730,374, May 3, 1985, Pat. No. 4,659,094.

[51] Int. Cl.$^4$ .............................................. G01B 3/30
[52] U.S. Cl. .................................... 29/271; 29/281.6; 29/468; 33/655
[58] Field of Search ................... 29/271, 281.5, 281.6, 29/467, 468, 406, 464; 33/181 R

[56] References Cited

U.S. PATENT DOCUMENTS

| | | | |
|---|---|---|---|
| 1,224,069 | 4/1917 | Clayton | 29/271 |
| 4,212,098 | 7/1980 | Sand | 29/271 |
| 4,295,276 | 10/1981 | Ellington, III | 29/271 |
| 4,343,992 | 8/1982 | Blaser | 29/271 |

Primary Examiner—Gil Weidenfeld
Assistant Examiner—Daniel W. Howell
Attorney, Agent, or Firm—Blakely, Sokoloff, Taylor & Zafman

[57] ABSTRACT

A method for centering a semiconductor wafer on a vacuum chuck having a centered shaft. A shaft centering tool which is contained in pre-existing openings in a housing surrounding the shaft is used to define the desired location of the shaft. A second device having the same circumference as the wafer, is employed on the chuck in order that teflon guides can be set into position around the chuck. Once the guides are set, wafers introduced into the guides will be centered on the chuck.

4 Claims, 5 Drawing Figures

CENTERING/POSITIONING APPARATUS FOR WAFER AND VACUUM CHUCK

This is a divisional of application Ser. No. 730,374 filed May 3, 1985, now U.S. Pat. No. 4,659,094.

BACKGROUND OF THE INVENTION

1. Field of the Invention

This invention relates to the field of devices used to hold and spin a wafer during the application of photoresist. More specifically, this invention relates to centering wafers on a vacuum chuck and positioning the chuck/motor subassembly on which the semiconductor wafer rests during the application of photoresist.

2. Prior Art

In the manufacture of semiconductor products, it is often desired to apply photoresist to a semiconductor wafer. Typically this is done by placing the wafer on a platform where vacuum holds the wafer in place. This is referred to as a vacuum chuck. The chuck is mounted on a shaft which turns at approximately 5-6000 rpm. A certain amount of photoresist is placed on the spinning wafer and centrifugal force causes the photoresist to spread evenly over the surface of the wafer. Should the wafer not be centered on the chuck properly, or the shaft is not positioned properly, the photoresist will be thicker on one area of the surface of the wafer than in other areas. This results in lower yields from that wafer since subsequent process steps are based on estimated thickness of the photoresist layer. Additionally, if the wafer is not centered, or the shaft is not positioned properly, excess vibration could eject the wafer from the chuck, further reducing yield.

In the prior art, wafers are centered on the chuck in the following manner. An aluminum wafer, of the same dimensions as the process wafers and having a hole in the center, is placed on the vacuum chuck. There is also a hole in the center of the chuck itself. Using eyesight, these holes are aligned, resulting in the wafer resting in the middle of the chuck. At that time, telfon guides are placed on either side of the wafer, tightened in place, and the aluminum wafer is removed. During processing, the teflon guides place wafers on the chuck. Each wafer is placed on the chuck in the same location as the initial aluminum wafer. In order to operate effectively, the shaft/motor subassembly itself has to be positioned and leveled. When the shaft assembly is not positioned and centered, an uneven distribution of the photoresist on the surface of the wafer results. In addition, there is vibration in the chuck and the wafer which could eject the wafer from the chuck and result in lower yield. The shaft/motor assembly must be positioned, centered and levelled each time the machine is disassembled. In the prior art, this was done by aligning the shaft by sight, reassembling the machine, checking the location of the shaft, disassembling the machine, placing the shaft in a new location, reassembling the machine, again checking the location of the shaft by sight, and continuing the process until the shaft appears to be positioned and centered. Depending upon the experience of the user, the machine had to be assembled and disassembled 3 to 6 times with shaft centering and positioning taking 40 minutes to one hour to complete.

Disadvantages of the prior art wafer centering process are several. A first problem arises when the hole in the center of the wafer and the hole in the center of the chuck are not of the same diameter. If the hole in the wafer is larger than the hole in the chuck, the user must attempt to center the chuck hole within the hole in the wafer. When the hole in the wafer is smaller than the hole in the chuck, the user is essentially guessing where the center of the chuck hole is when aligning the wafer. Second, when placing the teflon guides around the wafer, the user must hold the wafer with one hand, to prevent it from slipping off center, and work the guides with the other hand. Third, when tightening the guides, the wafer must still be held in place with one hand while the other tightens the guides.

The disadvantage of the prior art method of positioning the shaft/motor assembly is the obvious time waste in disassembling and reassembling the housing repeated times, and if the final position is not correct, the uneven distribution of photoresist.

The present invention seeks to solve these problems with a simple yet effective solution.

SUMMARY OF THE PRESENT INVENTION

The present invention consists of an aluminum standard which is used instead of a wafer when setting the teflon guides for wafer centering on the vacuum chuck. The standard rests on the chuck and employs an overhanging edge to hold the standard in place while the teflon guides are moved and set. There is also a provision for the use of a screw inserted through the standard and into the center hole of the chuck, to hold the standard in place during centering.

In order to center and position the shaft/motor assembly and the chuck, a device is used which is placed on a pre-existing plate of the chuck housing and is held in place by protrusions that fit into openings in the plate. The device dimensions are such that the center line of the shaft is automatically aligned. The device also utilizes a longitudinal shaft guide to assure that the shaft is true.

DETAILED DESCRIPTION OF THE PRESENT INVENTION

A method for providing a centered wafer on a centered shaft/motor assembly during application of photoresist is described. A shaft/motor assembly centering tool is used to speed up and make more reliable the alignment of the shaft/motor assembly while a wafer centering tool provides accurate centering of the wafer. In the following description, numerous specific details are set forth, such as wafer size, etc., in order to provide a thorough understanding of the present invention. It will be obvious however, to one skilled in the art, that the invention may be practiced without these specific details. In other instances, well known structures have not been described in detail in order not to unnecessarily obscure the present invention.

When utilizing a vacuum chuck for holding wafers during the application of photoresist, it is necessary to center the wafers on the chuck for optimum performance. Although the invention contemplates the use of one size of wafer (e.g., 4 inch wafers), the wafer centering procedure must be performed repeatedly since 4 inch wafers come in different tolerances. For example, due to the method of manufacture, the silicon ingot from which silicon wafers are cut has a varying diameter. Typically there are several zones of a silicon ingot, each having a diameter falling in a certain range, but each used to make 4 inch wafers. The wafers may vary in size from 3.92 to 3.98 inches in diameter.

During photoresist processing of the wafers, a batch of wafers which all came from the same area of the ingot are used at one time. When wafers from a different area are reached the teflon guides which hold the wafer in place must be readjusted. If not, the wafers will not be centered properly, the photoresist will not be applied evenly, and the wafer may vibrate and be ejected from the rotating vaccum chuck. For this reason, the wafers must be centered each time a new set of wafers from a different zone of the silicon ingot are used. To best deal with several different diameters of wafers, the present invention contemplates 2 different sizes of wafer centering tools. One tool is used for wafers in the range 3.92–3.95 and the other for wafers in the range 3.95–3.98. The remainder of the discussion will refer to the tool used for the smaller wafers.

Figure 1:
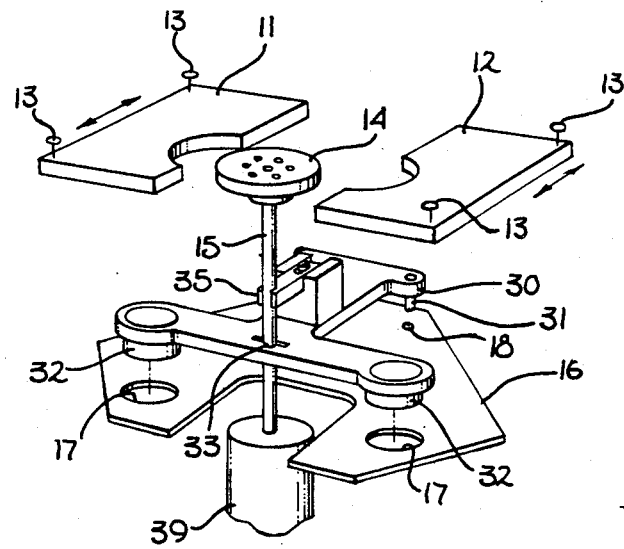
FIG. 1 illustrates a vacuum chuck and teflon guides.

Referring to FIG. 1, the vacuum chuck 14 is shown as a circular plate with a shaft 15 attached. The chuck contains holes in the surface which, through the use of suction, will hold a wafer lying on the surface of the chuck. To center a wafer on the chuck, a test wafer is placed on the chuck in the center, and the teflon guides 11 and 12 are moved around the chuck to contact the wafer and thus hold it in place. At that point the socket cap screws 13 are tightened, to set the location of the teflon guides 11 and 12. Once the guides are set, they move back and forth in the direction shown, each time setting a wafer on the chuck in the same position as the previous wafer. Part of the housing of the apparatus includes a plate 16 which includes large holes 17 near the shaft and smaller holes 18 away from the shaft.

Figure 4:
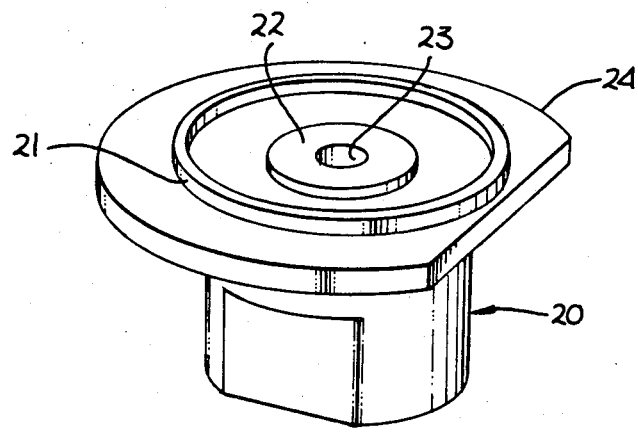
FIG. 4 illustrates a perspective view of the wafer centering device of the present invention.

The wafer centering tool 20 is illustrated in FIG. 4. In the preferred embodiment, the device is aluminum and approximately 2.00 inches in length. The outer edge of the tool 24 matches the outer circumference of that size of wafer which is to be used on the chuck. For the smaller size wafer, this dimension must be accurate within 2 thousandths of an inch for effective operation of the device. When the device contacts the chuck, the collar 21 surrounds the circumference of the chuck and prevents lateral movement of the tool. The mesa 22 contains a hole 23 in the center. For most applications, the mass of the device is sufficient to hold it in place while the teflon guides are adjusted. However, if need be, a screw can be inserted through this hole 23 and into a hole in the center of the chuck 14, the hole in the chuck being threaded. In this manner, the tool can be held firmly in place during centering and setting of the teflon guides.

Figure 5:
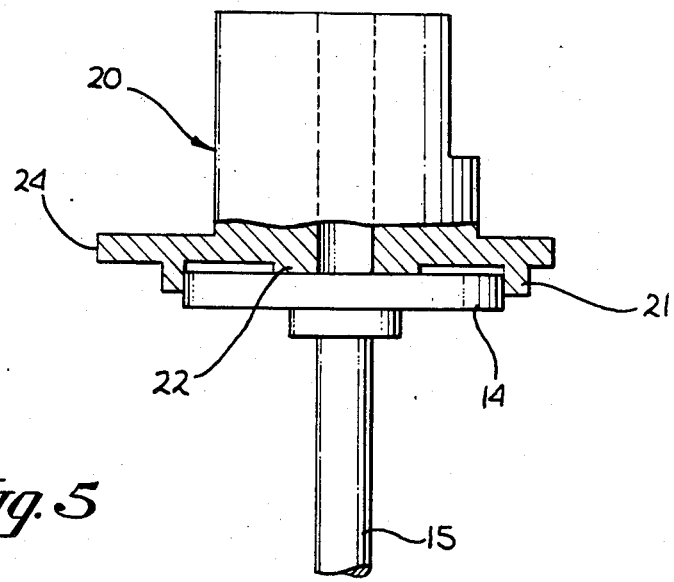
FIG. 5 illustrates a front view of the wafer centering device in operation.

As shown in FIG. 5, the centering tool is placed on the chuck and is held in place by the collar 21. The diameter of the circle formed by the collar 21 matches the diameter of the chuck 14. This diameter on the tool must be accurate to within plus or minus 5 thousandths of an inch to prevent too much play in the device which could result in inaccurate centering. The mesa area 22 must be flush with the chuck so the device when centered will be level.

The time savings as a result of using the present invention are substantial. The prior art methods of centering the wafer, depending on the skill of the operator, typically took 15 to 20 minutes. By utilizing the present invention, the wafer guides can be placed in the proper location in about 1 minute.

Shaft/Motor Assembly Centering Tool

The vacuum chuck is attached to the shaft 15 of FIG. 1 and the shaft is attached to motor 39. This shaft/motor assembly resides in a housing. This housing is disassembled for servicing on a regular basis as well as when wafer yields fall below a certain limit. Each time the housing is disassembled, the shaft/motor assembly must be repositioned. In the prior art, this was done by eye, with the operator centering the shaft by sight, reassembling the housing, checking to see if the shaft assembly was positioned properly, disassembling the machine and adjusting the shaft, reassembling the machine to check the position of the shaft, and repeating this until the operator was satisfied that the shaft was positioned properly. An experienced operator typically had to disassemble and reassemble the machine several times which took between 40 minutes and one hour.

Part of the housing remains stationary during all disassemblies and reassemblies. That part is the plate 16 shown in FIG. 1. The shaft/motor centering tool of the present invention utilizes this plate to enable an operator to center and position the shaft/motor assembly accurately the first time in 1 to 5 minutes.

Figure 2:
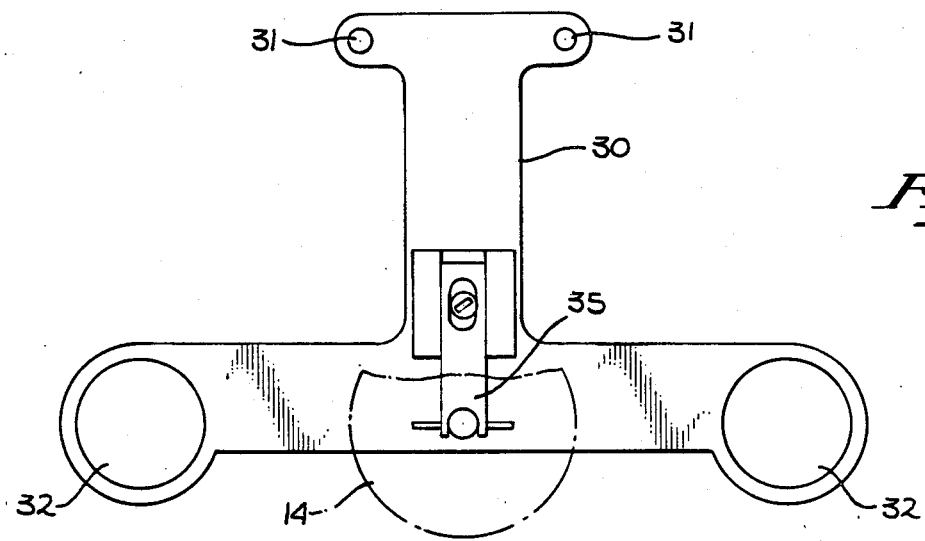
FIG. 2 illustrates a top view of the shaft/motor assembly centering and positioning device of the present invention.
Figure 3:
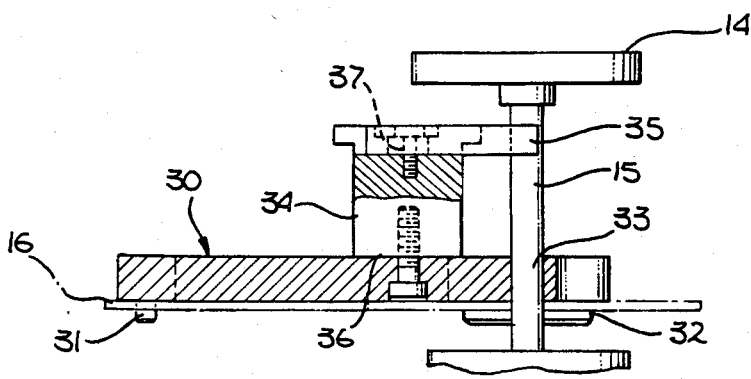
FIG. 3 illustrates a side view of the shaft/motor assembly centering and positioning device of the present invention.

The shaft/motor positioning tool is shown in FIGS. 1–3. The tool 30 is comprised of pins 31, feet 32, shaft hole 33 and shaft brace 35. The tool 30 takes advantage of the fact that the plate 16 is in a fixed location in the housing. When the housing is disassembled the tool 30 is placed on the plate 16. The pins 31 fit into holes 18 of the plate while the feet 32 rest in holes 17 of the plate. In this manner the tool is in a fixed and repeatable position. Next the vacuum chuck 14 is removed from the shaft 15. Then the tool is placed on the shaft 15 and seated in the holes 17 and 18. The tolerances of the tool are such that when the shaft 15 is inserted through the shaft hole 33 and shaft brace 35, the shaft is positioned correctly for operation. Although the shaft hole 33 alone would be sufficient to center the shaft, the addition of the shaft brace 35 insures that the shaft will be "true", that is, straight up and down when in place. After centering, the shaft/motor assembly is tightened in place and removed by sliding the tool 30 off the shaft and replacing the chuck 14.

In the preferred embodiment, the shaft centering tool 30 is aluminum, although other materials such as stainless steel may be utilized. The construction of the tool 30 is in 3 parts, a lower part containing the feet 32 and pins 31 an upper part 34 and the shaft brace 35. The lower and upper parts are held together by a screw inserted through the hole 36 of the lower piece and entering the top piece 34. The shaft brace is attached by a screw through hole 37 to the upper part 34. It will be obvious, however, to one skilled in the art that other means of attachment may utilized.

Thus, means have been described for positioning the shaft of a rotating chuck used for the application of photoresist, and of centering a semiconductor wafer on the chuck of the shaft.

I claim:

1. A device for defining a desired location for a shaft/motor assembly located in a housing having a plurality of fixed openings comprising:

a rigid member having a first and second end;

a first cross member orthogonally disposed on said first end; said first cross member having a pair of first projections thereon, said first projections demountably engaging a first pair of fixed openings in said housing;

a second cross member orthogonally disposed on said second end; said second cross member having a pair of second projections thereon; said second projections demountably engaging a second pair of fixed openings in said housing;

said second cross member defining a first aperture therethrough for retaining said shaft of said shaft/motor assembly, said first aperture coincident with said desired location when said projections engage said fixed openings;

whereby said shaft/motor assembly may be easily placed at said desired location.

2. The device as defined by claim 1 further including:

a raised member attached to said rigid member;

an arm attached to said raised member and extending over said first aperture, said arm defining a second aperture coincident with said first aperture for providing longitudinal positioning of said shaft.

3. The device as defined by claim 2 wherein said raised member is attached to said rigid member by a bolt extending through said base and threadedly engaging a tapped hole in said raised member.

4. The device as defined by claim 3 wherein said arm is attached to said raised member by means of a bolt extending through said arm and threadedly engaging said tapped hole.

* * * * *